US010734990B2

(12) United States Patent  
Komo et al.

(10) Patent No.: US 10,734,990 B2  
(45) Date of Patent: Aug. 4, 2020

(54) SEMICONDUCTOR APPARATUS

(71) Applicant: Mitsubishi Electric Corporation, Tokyo (JP)

(72) Inventors: Hideo Komo, Tokyo (JP); Shoji Saito, Tokyo (JP); Takeshi Omaru, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 408 days.

(21) Appl. No.: 15/741,873

(22) PCT Filed: Jan. 8, 2016

(86) PCT No.: PCT/JP2016/050532  
§ 371 (c)(1),  
(2) Date: Jan. 4, 2018

(87) PCT Pub. No.: WO2017/119126  
PCT Pub. Date: Jul. 13, 2017

(65) Prior Publication Data  
US 2018/0219543 A1    Aug. 2, 2018

(51) Int. Cl.  
*H03K 17/082* (2006.01)  
*H03K 17/14* (2006.01)  
*H03K 17/567* (2006.01)  
*H03K 17/08* (2006.01)

(52) U.S. Cl.  
CPC ....... *H03K 17/0828* (2013.01); *H03K 17/145* (2013.01); *H03K 17/567* (2013.01); *H03K 2017/0806* (2013.01)

(58) Field of Classification Search  
CPC ............. H03K 17/0828; H03K 17/145; H03K 17/567; H03K 2017/0806

USPC .......................................................... 361/78  
See application file for complete search history.

(56) References Cited

U.S. PATENT DOCUMENTS 9,074,941 B1 * 7/2015 Krichevsky .............. G01K 7/01  
2008/0002326 A1    1/2008 Watanabe  
2010/0046123 A1    2/2010 Fukami

FOREIGN PATENT DOCUMENTS

JP    S64-037135 U    3/1989  
JP    H01-301189 A    12/1989  
JP    H04-326748 A    11/1992  
JP    2002-290222 A    10/2002

(Continued)

OTHER PUBLICATIONS

International Search Report issued in PCT/JP2016/050532; dated Feb. 2, 2016.

(Continued)

*Primary Examiner* — Kevin J Comber  
(74) *Attorney, Agent, or Firm* — Studebaker & Brackett PC

(57) ABSTRACT

A current detection circuit (4) detects a device current flowing in the semiconductor device (1). A voltage detection circuit (5) detects a device voltage applied to the semiconductor device (1). A temperature calculation device (6) has a table collecting device temperatures of the semiconductor device (1) respectively corresponding to plural collector currents and plural collector voltages, and reads out a device temperature corresponding to the device current detected by the current detection circuit (4) and the device voltage detected by the voltage detection circuit (5) from the table.

14 Claims, 8 Drawing Sheets

(56) References Cited

FOREIGN PATENT DOCUMENTS

| | | |
|---|---|---|
| JP | 2008-035684 A | 2/2008 |
| JP | 2010-050530 A | 3/2010 |

OTHER PUBLICATIONS

Notification of Transmittal of Translation of the International Preliminary Report on Patentability (Chapter I) and Translation of Written Opinion of the International Searching Authority; PCT/JP2016/050532; dated Jul. 19, 2018.

An Office Action; "Notification of Reasons for Refusal," issued by the Japanese Patent Office dated Dec. 18, 2018, which corresponds to Japanese Patent Application No. 2017-560013 and is related to U.S. Appl. No. 15/741,873; with English Translation.

* cited by examiner

| | | \multicolumn{6}{c}{$V_{CE}$} | | | | | |
|---|---|---|---|---|---|---|---|
| | | 0 | V1 | V2 | V3 | V4 | ... |
| $I_C$ | 0 | $T_j(0,0)$ | $T_j(1,0)$ | $T_j(2,0)$ | $T_j(3,0)$ | $T_j(4,0)$ | $T_j(\cdots,0)$ |
| | I1 | $T_j(0,1)$ | $T_j(1,1)$ | $T_j(2,1)$ | $T_j(3,1)$ | $T_j(4,1)$ | $T_j(\cdots,1)$ |
| | I2 | $T_j(0,2)$ | $T_j(1,2)$ | $T_j(2,2)$ | $T_j(3,2)$ | $T_j(4,2)$ | $T_j(\cdots,2)$ |
| | I3 | $T_j(0,3)$ | $T_j(1,3)$ | $T_j(2,3)$ | $T_j(3,3)$ | $T_j(4,3)$ | $T_j(\cdots,3)$ |
| | I4 | $T_j(0,4)$ | $T_j(1,4)$ | $T_j(2,4)$ | $T_j(3,4)$ | $T_j(4,4)$ | $T_j(\cdots,4)$ |
| | ... | $T_j(0,\cdots)$ | $T_j(1,\cdots)$ | $T_j(2,\cdots)$ | $T_j(3,\cdots)$ | $T_j(4,\cdots)$ | $T_j(\cdots,\cdots)$ |

SEMICONDUCTOR APPARATUS

FIELD

The present invention relates to a semiconductor apparatus capable of monitoring the temperature of a semiconductor device at all times.

BACKGROUND

In a semiconductor apparatus used in power control equipment or the like, the temperature of a semiconductor device is monitored to prevent breakdown of the semiconductor device due to heating of the semiconductor device under energization. A measurement based on a thermistor, a measurement based on a temperature sense diode, etc. are known as monitoring methods. It is impossible to perform an accurate temperature measurement by the former measurement. An effective area to collector current is small in the latter measurement because a temperature sense diode is mounted on a semiconductor device. Under such circumstances, a technique of calculating the temperature from the temperature characteristic of a collector voltage when constant collector current is applied has been proposed (see PTL 1, for example).

CITATION LIST

Patent Literature

[PTL 1] JP H4-326748A

SUMMARY

Technical Problem

In the technique of PTL 1, a monitoring timing is limited to only a collector current at one certain point. Therefore, there is a problem that the monitoring timing is limited to a start-up time or the like.

The present invention has been implemented to solve the problem as described above, and has an object to obtain a semiconductor apparatus capable of monitoring the temperature of a semiconductor device at all times.

Solution to Problem

A semiconductor apparatus according to the present invention includes: a semiconductor device; a current detection circuit detecting a device current flowing in the semiconductor device; a voltage detection circuit detecting a device voltage applied to the semiconductor device; and a temperature calculation device having a table collecting device temperatures of the semiconductor device respectively corresponding to plural collector currents and plural collector voltages, and reading out a device temperature corresponding to the device current detected by the current detection circuit and the device voltage detected by the voltage detection circuit from the table.

Advantageous Effects of Invention

In the present invention, a table collecting the device temperatures of the semiconductor device respectively corresponding to the plural collector currents and the plural collector voltages is prepared in advance. The temperature calculation device reads out the device temperature corresponding to the device current detected by the current detection circuit and the device voltage detected by the voltage detection circuit from the table. Therefore, the temperature of the semiconductor device can be monitored at all times.

DESCRIPTION OF EMBODIMENTS

A semiconductor apparatus according to the embodiments of the present invention will be described with reference to the drawings. The same components will be denoted by the same symbols, and the repeated description thereof may be omitted.

Embodiment 1

Figures 1, 2:
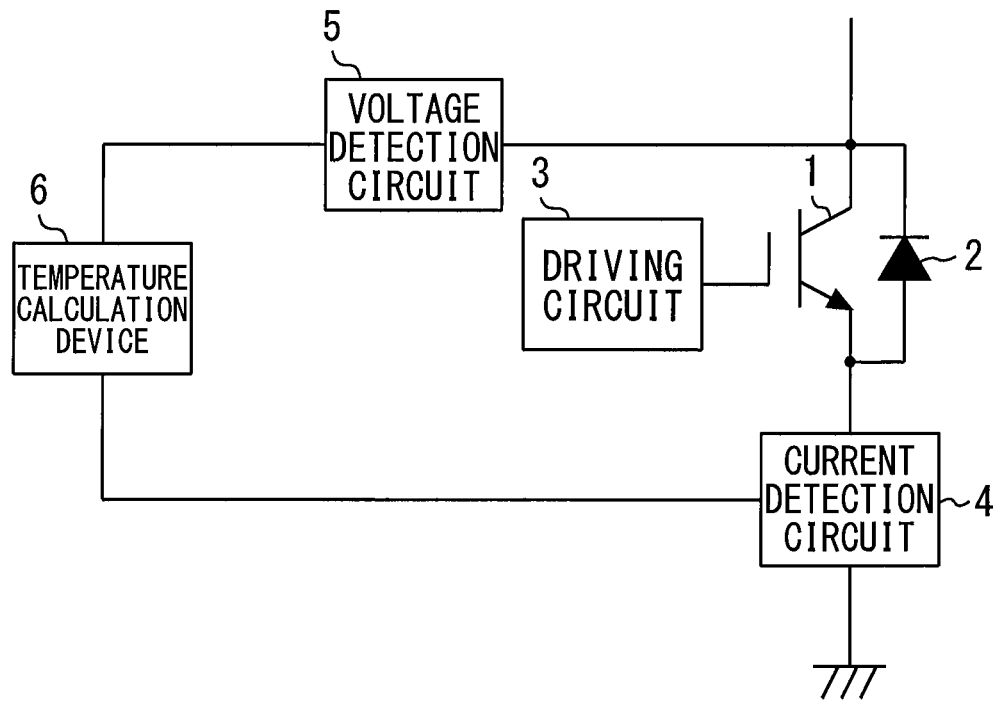
FIG. 1 is a diagram showing a semiconductor apparatus according to an embodiment 1 of the present invention.
FIG. 2 is a diagram showing the table stored in the temperature calculation device.

FIG. 1 is a diagram showing a semiconductor apparatus according to an embodiment 1 of the present invention. In this embodiment, a semiconductor device 1 is an insulated gate bipolar transistor (IGBT). The semiconductor device 1 is not limited to the IGBT, but may be MOSFET (Metal-Oxide-Semiconductor Field-Effect Transistor), a Schottky barrier diode (SBD), a PN diode or the like. A diode 2 is connected in antiparallel to the semiconductor device 1. A driving circuit 3 applies a gate voltage $V_G$ to the gate of the semiconductor device 1 to drive the semiconductor device 1.

A current detection circuit 4 is a shunt resistor or the like, for example, and detects a collector current $I_c$ (device current) flowing in the semiconductor device 1. A voltage detection circuit 5 is a DESAT circuit or the like, for example, and detects a collector voltage $V_{CE}$ (device voltage) applied to the semiconductor device 1.

A temperature calculation device 6 is a microcomputer for executing programs stored in a memory. A table is recorded in the memory of the temperature calculation device 6. FIG. 2 is a diagram showing the table stored in the temperature calculation device. The table is a collection of device temperatures $T_1$ of the semiconductor device 1 respectively corresponding to plural collector currents $I_c$ and plural collector voltages $V_{CE}$ which are measured in advance.

The temperature calculation device 6 reads out, from the table, a device temperature $T_j$ which corresponds to a collector current $I_c$ detected by the current detection circuit 4 and a collector voltage $V_{CE}$ detected by the voltage detection circuit 5. The temperature calculation device 6 is not limited to a microcomputer, but may be a processing circuit such as a system LSI or the like, or may execute the foregoing processing while plural processing circuits are cooperated with one another.

Figure 3:
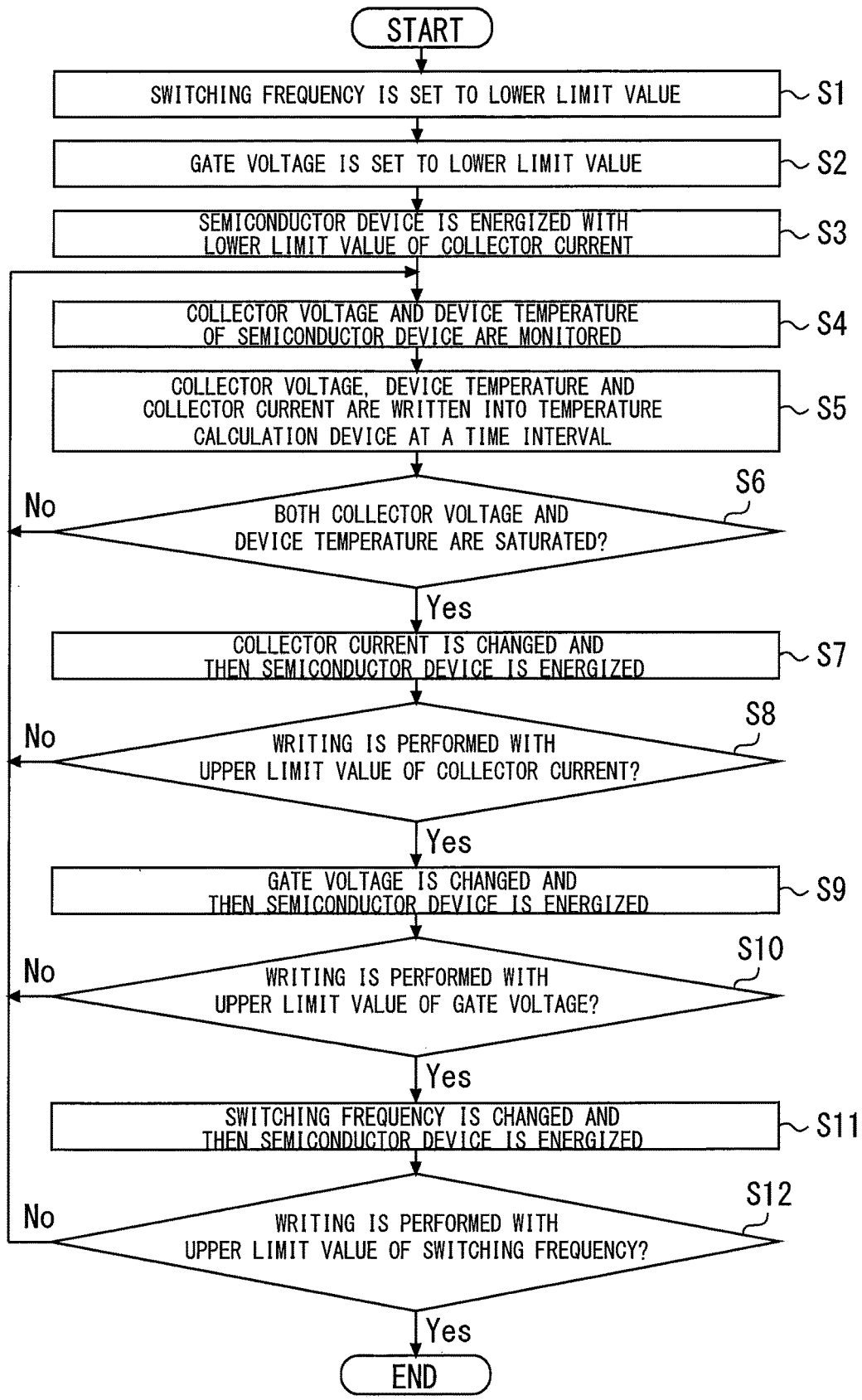
FIG. 3 is a flowchart showing a method of writing the table into the temperature calculation device.

FIG. 3 is a flowchart showing a method of writing the table into the temperature calculation device. First, a switching frequency when the driving circuit 3 drives the semiconductor device 1 is set to a lower limit value (step S1). Next, a gate voltage $V_G$ is set to a lower limit value (step S2). Next, the semiconductor device 1 is energized with the lower limit value of the collector current $I_c$ (step S3).

Next, the collector voltage $V_{CE}$ and the device temperature $T_j$ of the semiconductor device 1 are monitored (step S4). Even when the switching frequency, the gate voltage $V_G$ and the collector current $I_C$ are constant, the collector voltage $V_{CE}$ and the device temperature $T_j$ vary because the temperature of the semiconductor device 1 increases with lapse of the operating time.

Next, the collector voltage $V_{CE}$, the device temperature $T_j$ and the collector current $I_c$ are written into the temperature calculation device 6 at a time interval (step S5). When both the collector voltage $V_CE$ and the device temperature $T_j$ are saturated, the processing goes to next step S7, and when the collector voltage $V_{CE}$ or the device temperature $T_j$ are not saturated, the processing returns to step S4 (step S6). Next, the collector current $I_c$ is changed and then the semiconductor device 1 is energized (step S7).

Next, when writing is performed with the upper limit value of the collector current the processing goes to next step S9, and when the writing is not performed, the processing returns to step S4 (step S8). Next, the gate voltage $V_G$ is changed and then the semiconductor device 1 is energized (step S9). When writing is performed with the upper limit value of the gate voltage $V_G$, the processing goes to next step S11, and when the writing is not performed, the processing returns to step S4 (step S10).

Next, the switching frequency is changed and then the semiconductor device 1 is energized (step S11). When writing is performed with the upper limit value of the switching frequency, the processing is finished, and when the writing is not performed, the processing returns to step S4 (step S12).

As described above, in this embodiment, a table collecting the device temperatures $T_j$ of the semiconductor device 1 respectively corresponding to the plural collector currents $I_c$ and the plural collector voltages $V_{CE}$ is prepared in advance. A collector current $I_c$ and a collector voltage $V_cE$ which have dependency on the device temperature $T_j$ are detected, and the device temperature $T_j$ corresponding to the thus-detected collector current $I_c$ and collector voltage $V_{CE}$ is read out from the table, whereby the temperature of the semiconductor device 1 can be monitored at all times. Furthermore, since it is unnecessary to provide a temperature detection device to the semiconductor device 1, an effective area to the collector current is prevented from decreasing.

Embodiment 2

Figure 4:
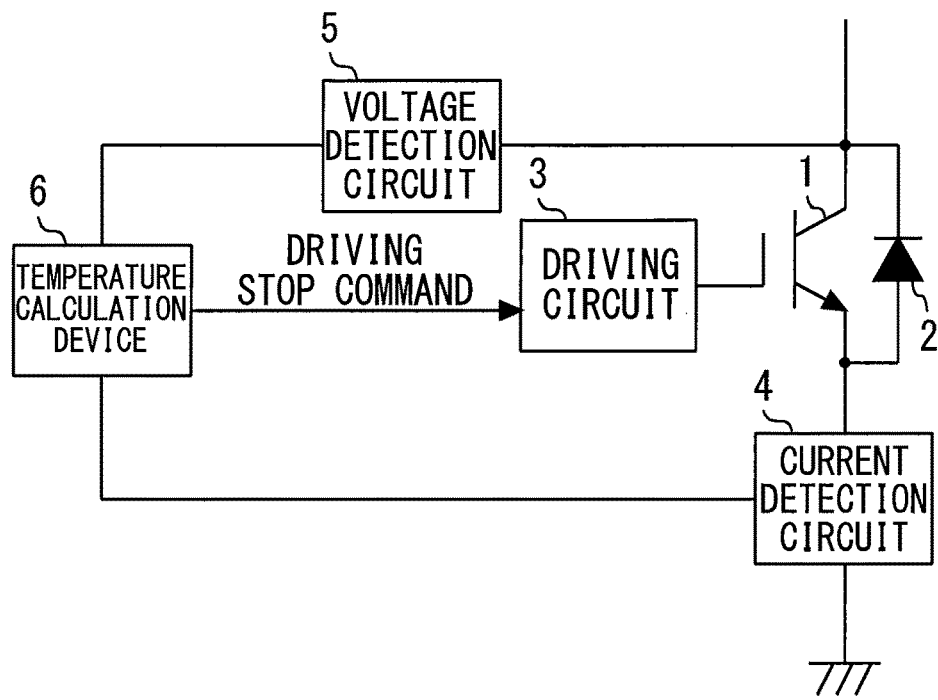
FIG. 4 is a diagram showing a semiconductor apparatus according to an embodiment 2 of the present invention.

FIG. 4 is a diagram showing a semiconductor apparatus according to an embodiment 2 of the present invention. The temperature calculation device 6 feeds back the calculated device temperature to the driving circuit 3, and transmits a driving stop command to the driving circuit 3 when the device temperature exceeds a threshold value, thereby forcibly stopping the operation of the driving circuit 3. As a result, the semiconductor device 1 can be protected under an overheating condition in which the device temperature increases to the threshold value or more.

Embodiment 3

Figure 5:
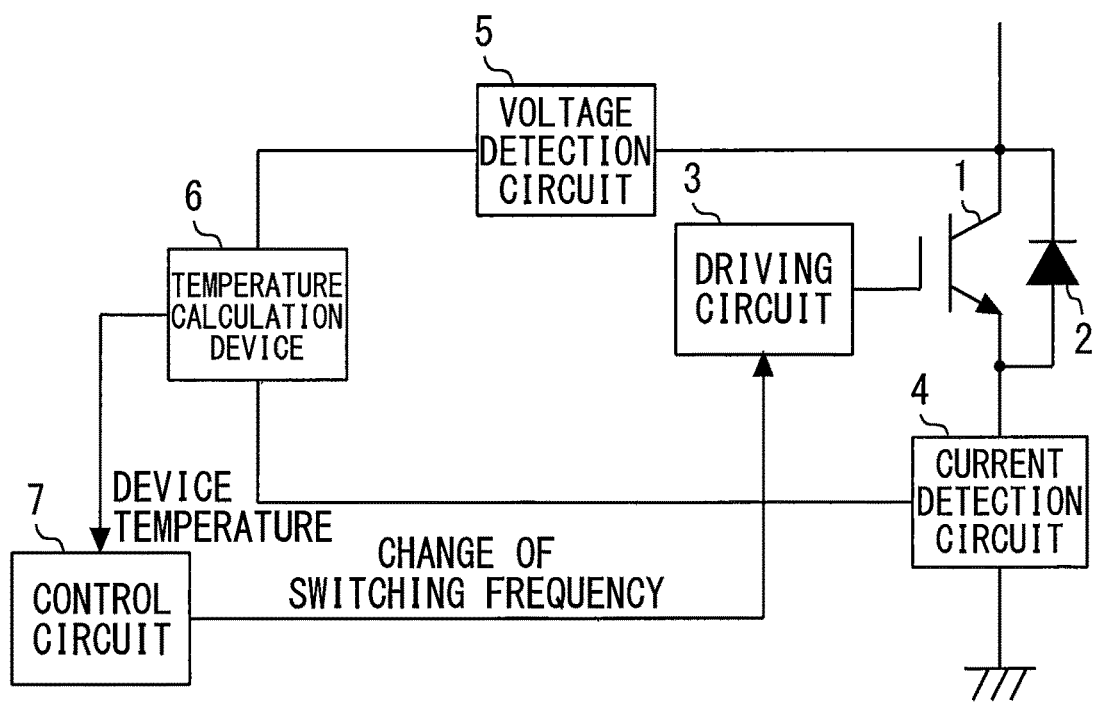
FIG. 5 is a diagram showing a semiconductor apparatus according to an embodiment 3 of the present invention.

FIG. 5 is a diagram showing a semiconductor apparatus according to an embodiment 3 of the present invention. The temperature calculation device 6 feeds back the calculated device temperature to a control circuit 7. According to the device temperature, the control circuit 7 controls a switching frequency when the driving circuit 3 drives the semiconductor device 1. For example, when the device temperature exceeds a threshold value preset in a microcomputer, the control circuit 7 decreases the switching frequency, and then when the device temperature decreases to a certain value, the control circuit 7 increases the switching frequency, whereby a proper switching frequency can be set.

Embodiment 4

Figure 6:
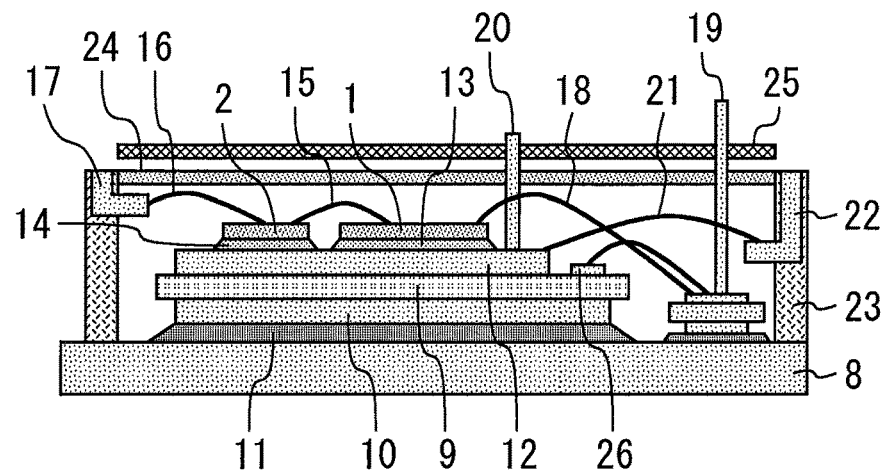
FIG. 6 is a cross-sectional view showing a semiconductor apparatus according to an embodiment 4 of the present invention.
Figure 7:
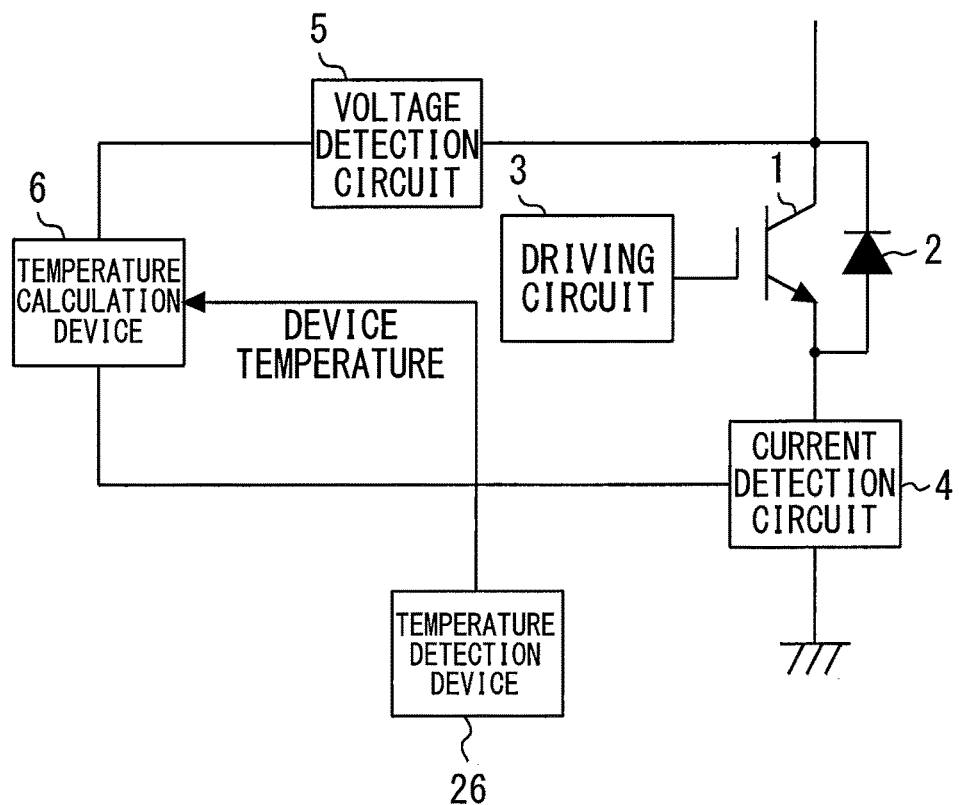
FIG. 7 is a diagram showing the semiconductor apparatus according to the embodiment 4 of the present invention.

FIG. 6 is a cross-sectional view showing a semiconductor apparatus according to an embodiment 4 of the present invention. FIG. 7 is a diagram showing the semiconductor apparatus according to the embodiment 4 of the present invention.

An insulating substrate 9 is mounted on a base plate 8. A bottom electrode 10 of the insulating substrate 9 is bonded to the base plate 8 via a solder 11. A semiconductor device 1 and a diode 2 are mounted on a top electrode 12 of the insulating substrate 9. A collector electrode of the semiconductor device 1 and a cathode electrode of the diode 2 are bonded to the top electrode 12 via solders 13, 14, respectively.

An emitter electrode of the semiconductor device 1 is connected to an anode electrode of the diode 2 by a wire 15. The anode electrode of the diode 2 is connected to a main electrode terminal 17 by a wire 16. A gate electrode of the semiconductor device 1 is connected to a control terminal 19 by a wire 18. The top electrode 12 is connected to a collector voltage output terminal 20, and also connected to a main electrode terminal 22 via a wire 21.

A side wall 22 formed of resin which surrounds the semiconductor device 1, etc. is provided on the base plate 8. The base plate 8 and the side wall 22 serve as a case. A noise shielding plate 24 is provided above the semiconductor device 1, etc., and a control board 25 is provided above the noise shielding plate 24. The control board 25 includes the driving circuit 3, the current detection circuit 4, the voltage detection circuit 5 and the temperature calculation device 6.

A temperature detection device 26 such as a thermistor is provided on the insulating substrate 9. This temperature detection device 26 detects the temperature $T_i$ of the insulating substrate 9 and feeds back the detected temperature $T_i$ to the temperature calculation device 6. The temperature calculation device 6 divides the difference between the device temperature $T_j$ and the temperature $T_i$ of the insulating substrate 9 by the collector current $I_c$ and the collector voltage $V_{CE}$ to calculate the thermal resistance between the semiconductor device 1 and the insulating substrate 9 according to the following mathematical formula 1.

$$\text{Thermal Resistance}=\Delta T/W=(T_j-T_i)/(I_C \times V_{CE}) \ [°C./W] \quad \text{(mathematical formula 1)}$$

When the thermal resistance increases, the temperature of the semiconductor device 1 increases remarkably. Accordingly, in order to suppress excessive heating of the semiconductor device 1, it is necessary to monitor the thermal resistance and control the driving of the semiconductor device 1. Furthermore, it can be grasped based on deterioration of the thermal resistance how degree the lifetime of a product is consumed.

Embodiment 5

Figure 8:
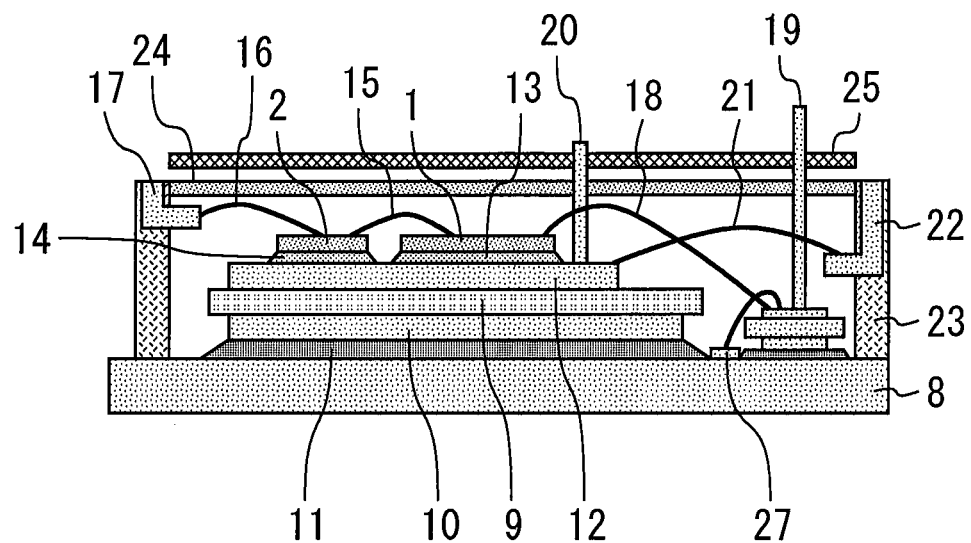
FIG. 8 is a cross-sectional view showing a semiconductor apparatus according to an embodiment 5 of the present invention.

FIG. 8 is a cross-sectional view showing a semiconductor apparatus according to an embodiment 5 of the present invention. A temperature detection device 27 such as a thermistor is provided on the base plate 8. The temperature detection device 27 detects the temperature of the base plate 8, that is, the temperature $T_C$ of the case for accommodating the semiconductor device 1 and feeds back the detected temperature $T_C$ to the temperature calculation device 6. The temperature calculation device 6 divides the difference between the device temperature $T_j$ and the temperature $T_C$ of the case by the collector current $I_C$ and the collector voltage $V_{CE}$ to calculate the thermal resistance between the semiconductor device 1 and the case according to the following mathematical formula 2, whereby the same effect as the embodiment 4 can be obtained.

$$\text{Thermal Resistance}=\Delta T/W=(T_j-T_C)/(I_C \times V_{CE}) \ [°C./W] \quad \text{(mathematical formula 2)}$$

Embodiment 6

Figure 9:
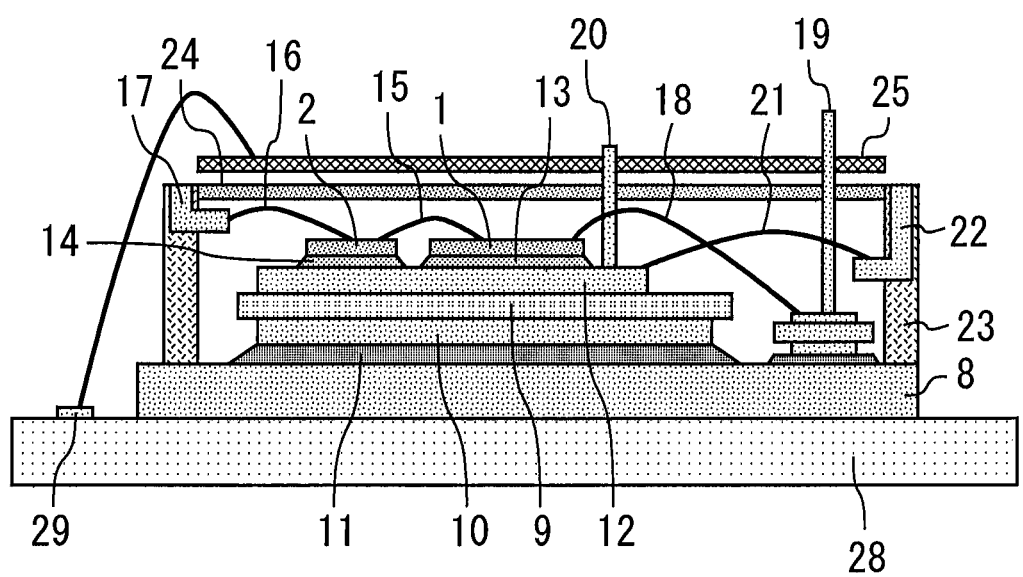
FIG. 9 is a cross-sectional view showing a semiconductor apparatus according to an embodiment 6 of the present invention.

FIG. 9 is a cross-sectional view showing a semiconductor apparatus according to an embodiment 6 of the present invention. A cooling unit 28 such as a heat sink is provided on the lower surface of the base plate 8. A temperature detection device 29 such as a thermistor is provided on the cooling unit 28. The temperature detection device 29 detects the temperature $T_W$ of the cooling unit 28 for cooling the semiconductor device 1 and feeds back the detected temperature $T_W$ to the temperature calculation device 6. The temperature calculation device 6 divides the difference between the device temperature $T_j$ and the temperature $T_W$ of the cooling unit 28 by the collector current $I_C$ and the collector voltage $V_{CE}$ to calculate the thermal resistance between the semiconductor device 1 and the insulating substrate 9 according to the following mathematical formula 3, whereby the same effect as the embodiment 4 can be obtained.

$$\text{Thermal Resistance}=\Delta T/W=(T_j-T_W)/(I_C \times V_{CE}) \ [°C./W] \quad \text{(mathematical formula 3)}$$

Embodiment 7

Figure 10:
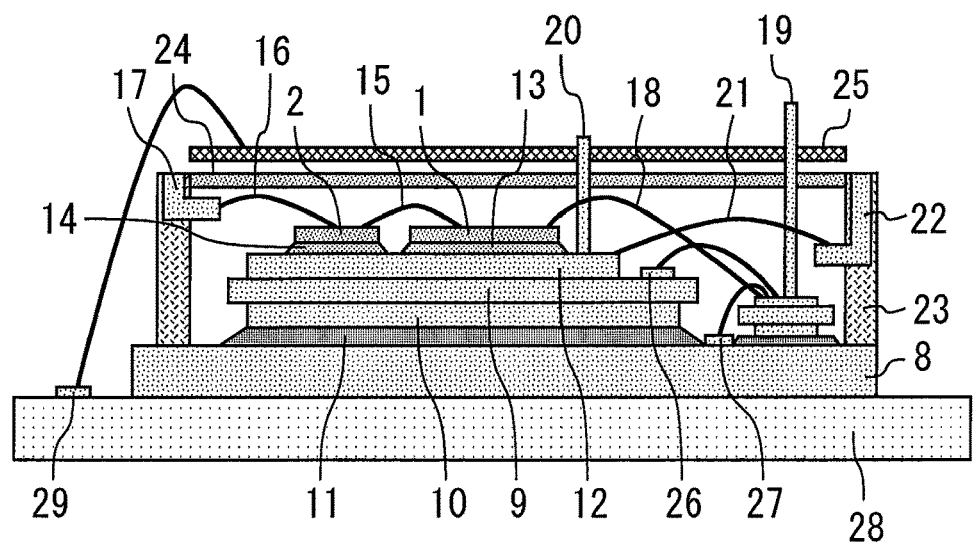
FIG. 10 is a cross-sectional view showing a semiconductor apparatus according to an embodiment 7 of the present invention.
Figure 11:
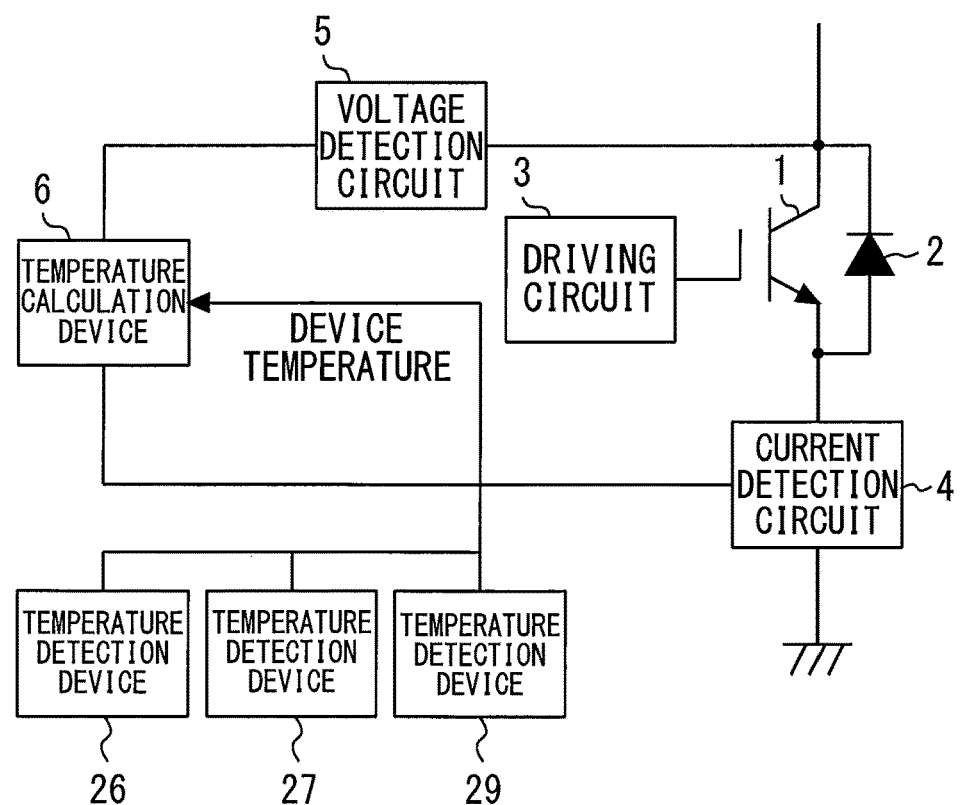
FIG. 11 is a diagram showing a semiconductor apparatus according to the embodiment 7 of the present invention.

FIG. 10 is a cross-sectional view showing a semiconductor apparatus according to an embodiment 7 of the present invention. FIG. 11 is a diagram showing a semiconductor apparatus according to the embodiment 7 of the present invention. All the temperature detection devices 26, 27 and 29 of the embodiments 4 to 6 are provided, and the temperature calculation device 6 calculates the thermal resistance of each part by referring to detection results thereof, whereby the thermal resistance of each part can be monitored on a real-time basis.

Embodiment 8

Figure 12:
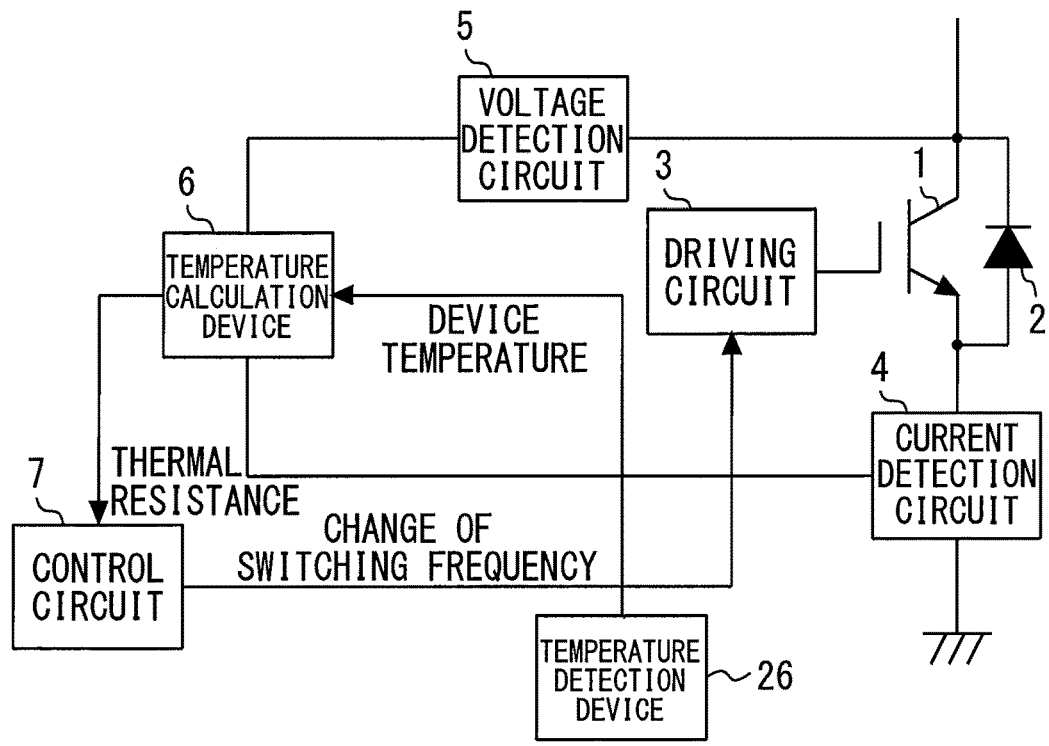
FIG. 12 is a diagram showing a semiconductor apparatus according to an embodiment 8 of the present invention.

FIG. 12 is a diagram showing a semiconductor apparatus according to an embodiment 8 of the present invention. The temperature calculation device 6 feeds back the calculated thermal resistance to the control circuit 7. According to the thermal resistance calculated by the temperature calculation device 6, the control circuit 7 controls the switching frequency when the driving circuit 3 drives the semiconductor device 1. For example, the control circuit 7 decreases the switching frequency when the thermal resistance exceeds a threshold value preset in a microcomputer, whereby excessive heating of the semiconductor device 1 at a place where thermal resistance has deteriorated can be suppressed.

Embodiment 9

Figure 13:
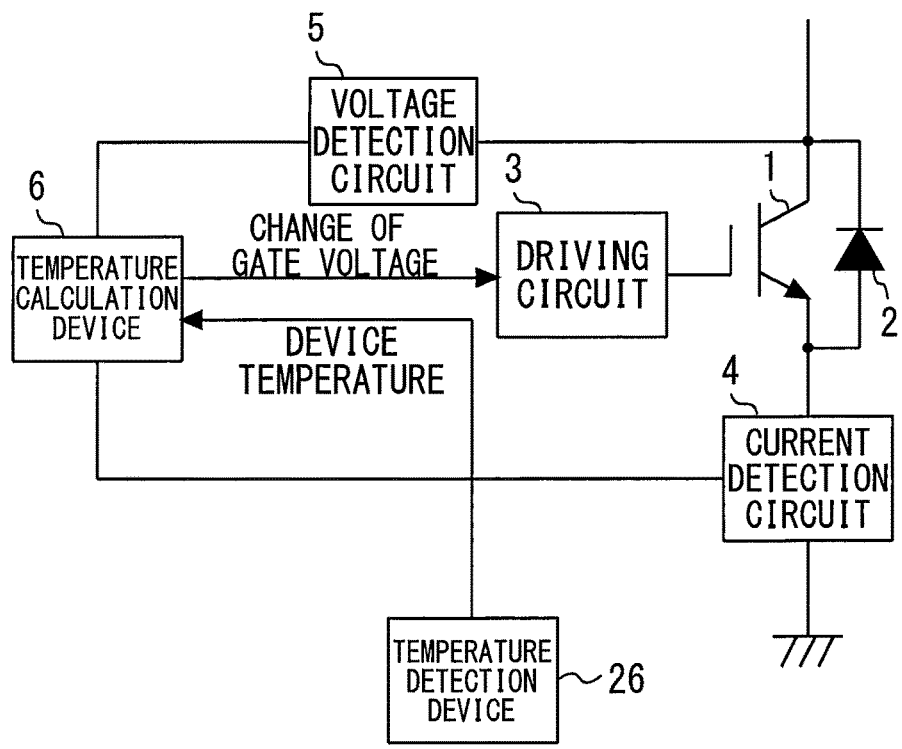
FIG. 13 is a diagram showing a semiconductor apparatus according to an embodiment 9 of the present invention.

FIG. 13 is a diagram showing a semiconductor apparatus according to an embodiment 9 of the present invention. The temperature calculation device 6 feeds back the calculated thermal resistance to the control circuit 7. The control circuit 7 causes the driving circuit 3 to decrease the gate voltage $V_G$ when the thermal resistance calculated by the temperature calculation device 6 exceeds a threshold value preset in a microcomputer. As a result, the collector current of the semiconductor device 1 at a place where thermal resistance has deteriorated is restricted, and excessive heating of the semiconductor device 1 can be suppressed.

Embodiment 10

Figure 14:
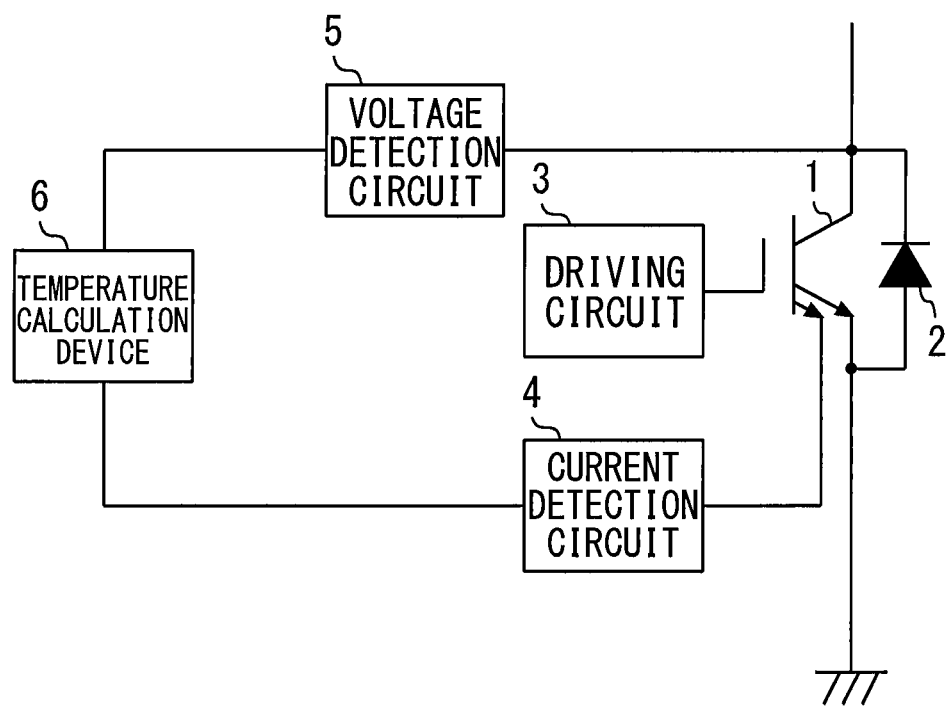
FIG. 14 is a diagram showing a semiconductor apparatus according to an embodiment 10 of the present invention.

FIG. 14 is a diagram showing a semiconductor apparatus according to an embodiment 10 of the present invention. In the embodiments 1 to 9, the current detection circuit 4 detects the collector current $I_C$ flowing in the semiconductor device 1. However, in this embodiment, collector sense current $I_{SENSE}=I_C/\alpha$ ($\alpha$ is equal to 10000, for example) is detected as the device current. In this case, the same effects as the embodiments 1 to 9 can be obtained.

The semiconductor device 1 and the diode 2 are not limited to devices formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST

1 semiconductor device; 3 driving circuit; 4 current detection circuit; 5 voltage detection circuit; 6 temperature calculation device; 7 control circuit; 8 base plate (case); 9 insulating substrate; 22 side wall (case); 26,27,29 temperature detection device; 28 cooling unit

The invention claimed is:

1. A semiconductor apparatus comprising:
 a semiconductor device;
 a current detection circuit detecting a device current flowing in the semiconductor device;
 a voltage detection circuit detecting a device voltage applied to the semiconductor device;
 a temperature calculation device having a table collecting device temperatures peculiar to the semiconductor device respectively corresponding to plural collector currents and plural collector voltages, and reading out a device temperature corresponding to the device current detected by the current detection circuit and the device voltage detected by the voltage detection circuit from the table;
 an insulating substrate on which the semiconductor device is mounted; and
 a temperature detection device detecting temperature of the insulating substrate,
 wherein the temperature calculation device divides a difference between the device temperature and temperature of the insulating substrate by the device current and the device voltage to calculate thermal resistance.

2. The semiconductor apparatus according to claim 1, further comprising:
 a driving circuit driving the semiconductor device; and
 a control circuit controlling a switching frequency when the driving circuit drives the semiconductor device according to thermal resistance calculated by the temperature calculation device.

3. The semiconductor apparatus according to claim 2, wherein the device current is a collector current or a collector sense current.

4. The semiconductor apparatus according to claim 1, further comprising a driving circuit applying a gate voltage to the semiconductor device to drive the semiconductor device,
 wherein the temperature calculation device causes the driving circuit to decrease the gate voltage when calculated thermal resistance exceeds a threshold value.

5. The semiconductor apparatus according to claim 4, wherein the device current is a collector current or a collector sense current.

6. The semiconductor apparatus according to claim 1, wherein the device current is a collector current or a collector sense current.

7. A semiconductor apparatus comprising:
 a semiconductor device;
 a current detection circuit detecting a device current flowing in the semiconductor device;
 a voltage detection circuit detecting a device voltage applied to the semiconductor device;
 a temperature calculation device having a table collecting device temperatures peculiar to the semiconductor device respectively corresponding to plural collector currents and plural collector voltages, and reading out a device temperature corresponding to the device current detected by the current detection circuit and the device voltage detected by the voltage detection circuit from the table;
 a case accommodating the semiconductor device; and
 a temperature detection device detecting temperature of the case,
 wherein the temperature calculation device divides a difference between the device temperature and temperature of the case by the device current and the device voltage to calculate thermal resistance.

8. The semiconductor apparatus according to claim 7, further comprising:
 a driving circuit driving the semiconductor device; and
 a control circuit controlling a switching frequency when the driving circuit drives the semiconductor device according to thermal resistance calculated by the temperature calculation device.

9. The semiconductor apparatus according to claim 7, further comprising a driving circuit applying a gate voltage to the semiconductor device to drive the semiconductor device,
 wherein the temperature calculation device causes the driving circuit to decrease the gate voltage when calculated thermal resistance exceeds a threshold value.

10. The semiconductor apparatus according to claim 7, wherein the device current is a collector current or a collector sense current.

11. A semiconductor apparatus comprising:
 a semiconductor device;
 a current detection circuit detecting a device current flowing in the semiconductor device;
 a voltage detection circuit detecting a device voltage applied to the semiconductor device;
 a temperature calculation device having a table collecting device temperatures peculiar to the semiconductor device respectively corresponding to plural collector currents and plural collector voltages, and reading out a device temperature corresponding to the device current detected by the current detection circuit and the device voltage detected by the voltage detection circuit from the table;
 a cooling unit cooling the semiconductor device; and
 a temperature detection device detecting temperature of the cooling unit,
 wherein the temperature calculation device divides a difference between the device temperature and temperature of the cooling unit by the device current and the device voltage to calculate thermal resistance.

12. The semiconductor apparatus according to claim 6, further comprising:
 a driving circuit driving the semiconductor device; and
 a control circuit controlling a switching frequency when the driving circuit drives the semiconductor device according to thermal resistance calculated by the temperature calculation device.

13. The semiconductor apparatus according to claim 11, further comprising a driving circuit applying a gate voltage to the semiconductor device to drive the semiconductor device,
 wherein the temperature calculation device causes the driving circuit to decrease the gate voltage when calculated thermal resistance exceeds a threshold value.

14. The semiconductor apparatus according to claim 11, wherein the device current is a collector current or a collector sense current.

* * * * *